United States Patent [19]

Cammarata

[11] Patent Number: 5,055,757
[45] Date of Patent: Oct. 8, 1991

[54] AUTOMATIC TORIOD TURNS COUNTER

[76] Inventor: Edward Cammarata, 1441 SW. 30th Ave., Pompano Beach, Fla. 33069

[21] Appl. No.: 589,186

[22] Filed: Sep. 27, 1990

[51] Int. Cl.$^5$ ............................................. G01R 31/02
[52] U.S. Cl. .................................. 318/640; 324/726; 324/546; 324/225; 318/625; 318/647
[58] Field of Search ................................. 318/560–646, 318/647; 324/200, 202, 225, 239, 546, 726

[56] References Cited

U.S. PATENT DOCUMENTS

| | | | |
|---|---|---|---|
| 2,479,699 | 8/1946 | Powell | 171/209 |
| 2,644,919 | 7/1953 | Duke et al. | 324/34 |
| 2,924,773 | 2/1960 | Lykke | 324/51 |
| 3,953,791 | 4/1976 | Spurr | 324/34 |
| 4,439,724 | 3/1984 | Morong, III | 324/726 |
| 4,990,860 | 2/1991 | Peterson | 324/726 |

OTHER PUBLICATIONS

High Speed Coil Turns Testing by Harry M. Ash, President, Tinsley–Scientific Sales, Allamuchy, N.J. 4/82 vol. 28, No. pp. 36–38.
"Toroid Turns Counter" Atlantic Magnetics, Inc. 4/76.
"The Wabash Coil Turns Analyzers", Wabash Relay & Electronics, Inc., 12/78.

*Primary Examiner*—Paul Ip
*Attorney, Agent, or Firm*—Oltman and Flynn

[57] ABSTRACT

A toroid turns counter for a toroid with at least one winding with turns to be counted by electric counting device connected to said winding having a test winding with an opening for receiving the toroid, a movable contact arm for electrically closing the opening after the toroid has been received in the opening, an activating arrangement which is coupled to the contact arm, and controls coupled to the activating arrangement for controlling the closure of the contact arm.

10 Claims, 2 Drawing Sheets

AUTOMATIC TORIOD TURNS COUNTER

The invention relates to a turns counter for toroid coils, and more particularly to a toroid turns counter with automatic activation of the turn measuring circuit.

BACKGROUND AND PRIOR ART

Toroid coil turns counters are known in which a toroid coil or transformer is inserted into a test circuit, wherein a test winding is closed, e.g. by means of a strap with an alligator clip, around the core of the toroid. The test winding is connected to a calibrated ac signal, and upon closure of the test winding, an ac-electromotive force is generated in each winding on the toroid. The electromotive force is directly proportional with the turns ratio between the number of turns in each winding on the toroid coil and the test winding. By measuring the electromotive force a direct measure of the number of turns in the measured winding is attained.

U.S. Pat. No. 3,953,791 is an example of a coil measuring device of this type. The measuring devices of the known type have the drawback that an extra manipulation step is required for each coil to be measured. Considering the fact that, often times, large numbers of coils have to be measured and evaluated, each extra step slows down the measuring process, which in turn leads to unwanted expense and a possible source of human mistakes.

It is therefore the object of the instant invention to overcome the drawbacks of the known coil test devices and to provide an arrangement for automatically activating the tester, including closure of the test winding.

SUMMARY OF THE INVENTION

There is accordingly provided a toroid turns counter for a toroid with at least one winding with turns to be counted by electric counting means connected to said winding, having a test winding with an opening for receiving the toroid, a movable contact arm for electrically closing the opening after the toroid has been received in the opening, an activating arrangement which is coupled to the contact arm, and controls coupled to the activating arrangement for controlling the closure of the contact arm.

In accordance with a further feature there is provided a toroid turns counter which has a servo mechanism for activating the contact arm, wherein the servo mechanism may have an electric motor or solenoid and linkage for coupling said motor or solenoid with the contact arm.

The toroid turns counter according to the invention may further include a switch arrangement connected to the activating arrangement, and a power source connected to the switch arrangement for driving the activating arrangement, and the switch arrangement may include a start key with start contacts coupled to said switch arrangements.

Further objects and advantages of this invention will be apparent from the following detailed description of a presently preferred embodiment which is illustrated diagrammatically in the accompanying drawings.

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

DESCRIPTION OF THE PREFERRED EMBODIMENTS

Figure 1:
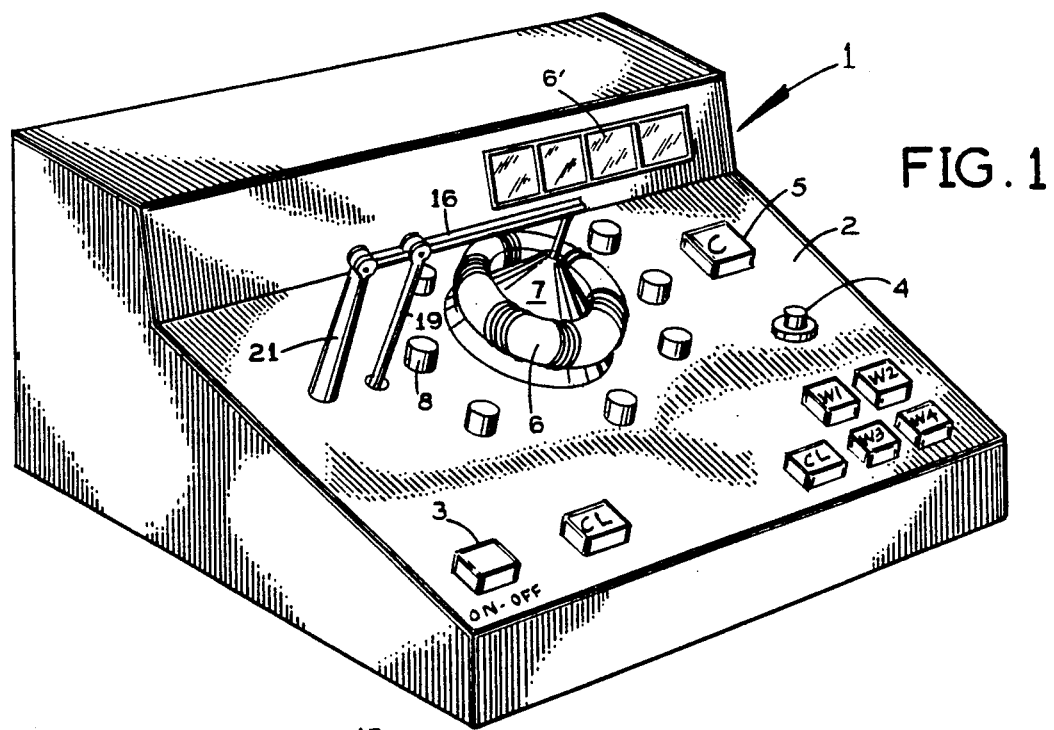
FIG. 1 is a perspective view of the invention showing the contact arm for closing the test winding in closed position.
Figure 2:
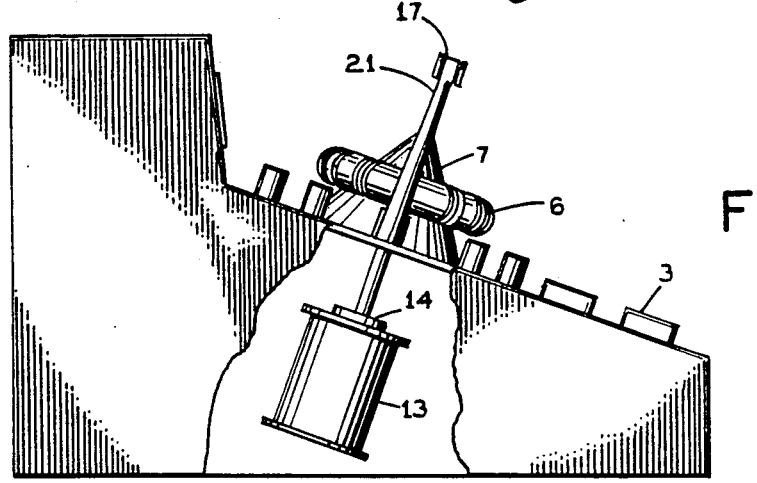
FIG. 2 is an elevational side cross-sectional view of the invention with part of the wall broken away to show the interior construction.
Figure 3:
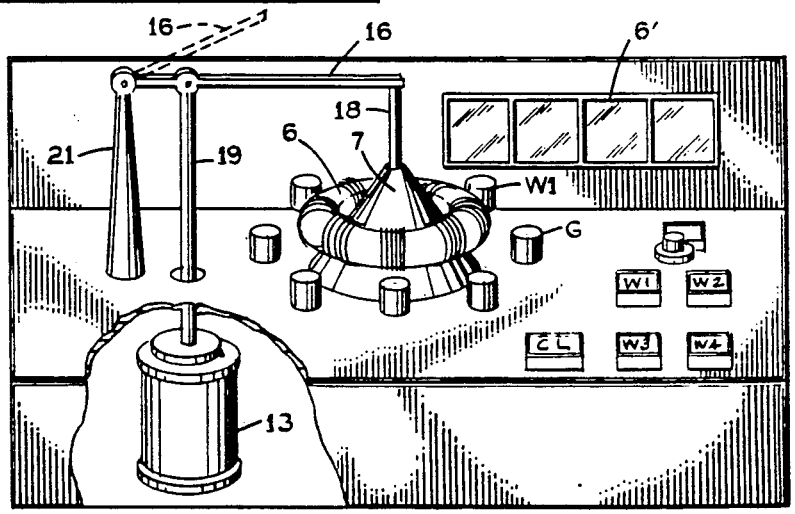
FIG. 3 is an elevational front view of the invention with part of the wall broken away to show the interior construction.

In FIG. 1 a housing 1 has a front panel 2 which is the working surface of the device. It has an on-off switch 3 for activating the internal circuits, a calibrating adjuster 4 for calibrating the measuring circuits, an indicator 5 to indicate that calibration is in effect, and a digital display 6 which displays the number of turns measured for each winding in response to activation of any one of a number of winding measuring switch buttons W1–Wn, of which four are shown. A toroidal coil 6 is placed in the working surface 2, centered on a cone 7 on the working surface 2, seen more clearly in FIGS. 2 and 3.

The toroid 6 is shown as having, for example, four windings w1–w4, each having a number of turns T1–T4, with each winding having two ends. During measurement each end of each winding is connected to corresponding winding posts 8 on the working surface 2 disposed around the perimeter of the toroid 6.

Figure 4:
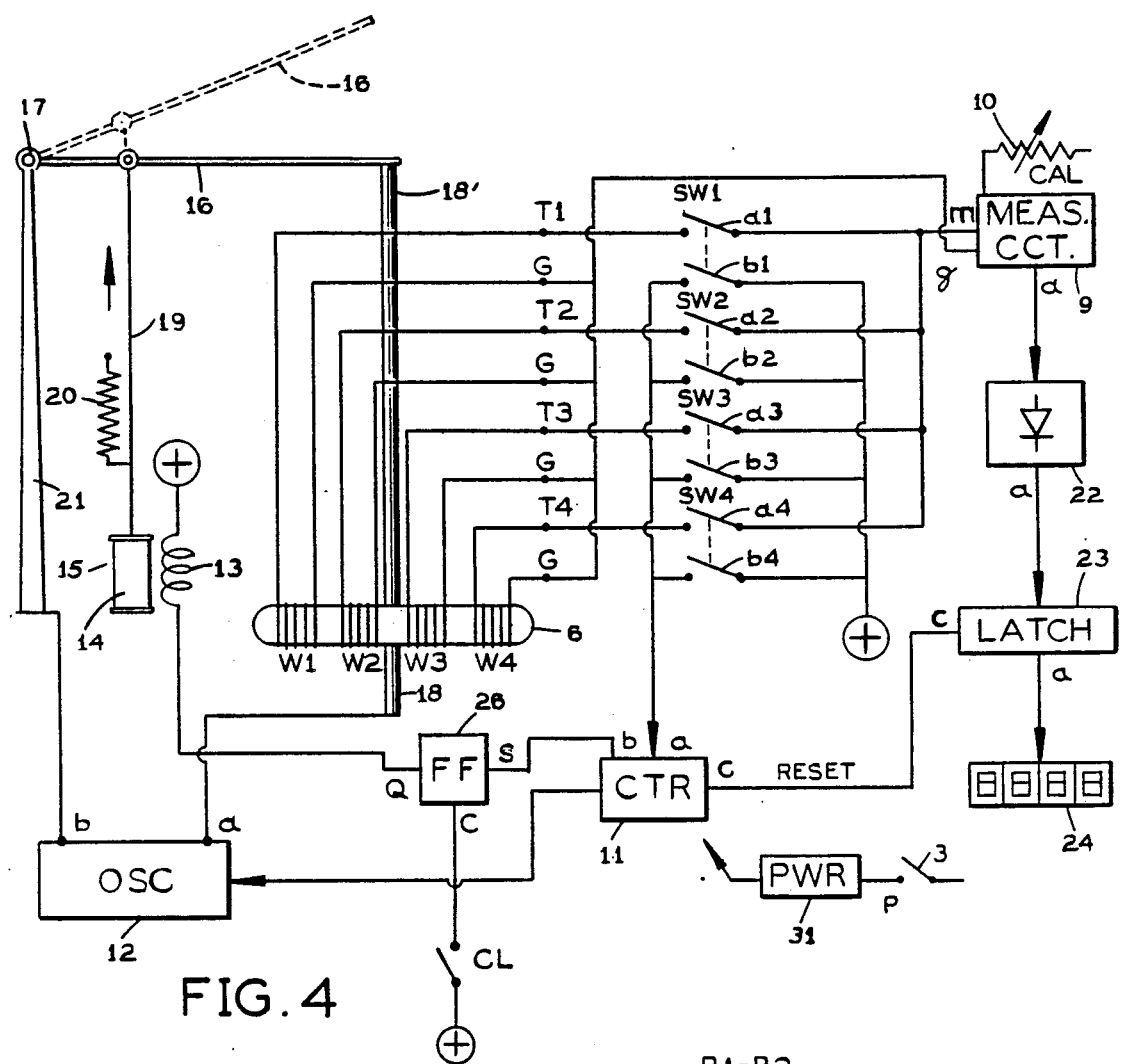
FIG. 4 is a circuit diagram of the invention.

FIG. 4 is a simplified block diagram of the circuit of the turns counter according to the invention. The toroid 6 to be measured is shown with four windings, w1–w4, each having two ends, of which one end is connected to binding posts T1–T2, and the other ends G commonly connected to common input g of measuring circuit 9, which also has a measuring input m for receiving the output from the other end of the windings.

Each of the other winding ends of windings w1–w4 is connected to a respective selection switch SW1–SW4, each of which has one contact a1–a4 selectively connecting the other ends of windings w1–w4 to measuring input m, and another contact b1–b4, each ganged with the corresponding contact a1–a4. Upon actuation of one of the switches SW1–SW4, the respective contact b1–b4 activates a control circuit with plus + potential on input a. The control circuit 11 in turn starts a measuring oscillator 12 which generates a given ac-voltage on outputs a, b. In addition, the control circuit 11 activates, via output b, a solenoid 13, with an armature 14 linked via linkage 19 to a pivotable contact arm 16, which pivots about pivot point 17 to close a test winding, which includes post 18 connected to terminal a of oscillator 12, leading through the center of toroid 6 via an upper contact end 18' of the post 18, contact arm 16, pivot point 17, return post 21 and back to terminal b of oscillator 12. Each of the toroid windings w1–w4 generate by induction an ac voltage corresponding to the number of turns at the corresponding terminal T1–T4. The ac voltage is connected to the measuring input m of the measuring circuit 9, which generates a proportional, calibrated output voltage at pin a, connected to a precision rectifier 22 which generates a digital output at its pin a, connected to a digital latch 23, connected at output a to a digital display 24. A calibration device 10 connected to the measuring circuit 9 is calibrated such that the display 24 shows the number of turns of the measured winding.

After recording the digital output, the operator activates the next W1-W4 button, releases the present W1-W4 button and operates and holds down the next W1-W4 button and records the turn number of the next winding. The brief interruption at control circuit 11, input a causes a latch reset pulse to appear on output c which clears the latch 23 which is now ready to store the turns figure for the next winding w1-w4.

When the first switch SW1-SW4 was operated, its corresponding contact b1-b4 activated control circuit 11 to set a flip-flop (FF) 26 at set input S, which in turn, at output Q energized the coil 13 of solenoid 15, causing the armature 14 to be drawn into the coil 13. As a result, linkage 19 operated the contact arm 16 to close, against the force of spring 20, to complete the circuit of the one turn test winding as described above. After completing all tests of the toroid G, the operator pushes a clear button CL, which clears the flip-flop 26, causing the coil 13 to be de-energized, and the sprsing 20 restores the contact arm 16 to its open position shown in dashed lines in FIGS. 3 and 4.

Figure 5:
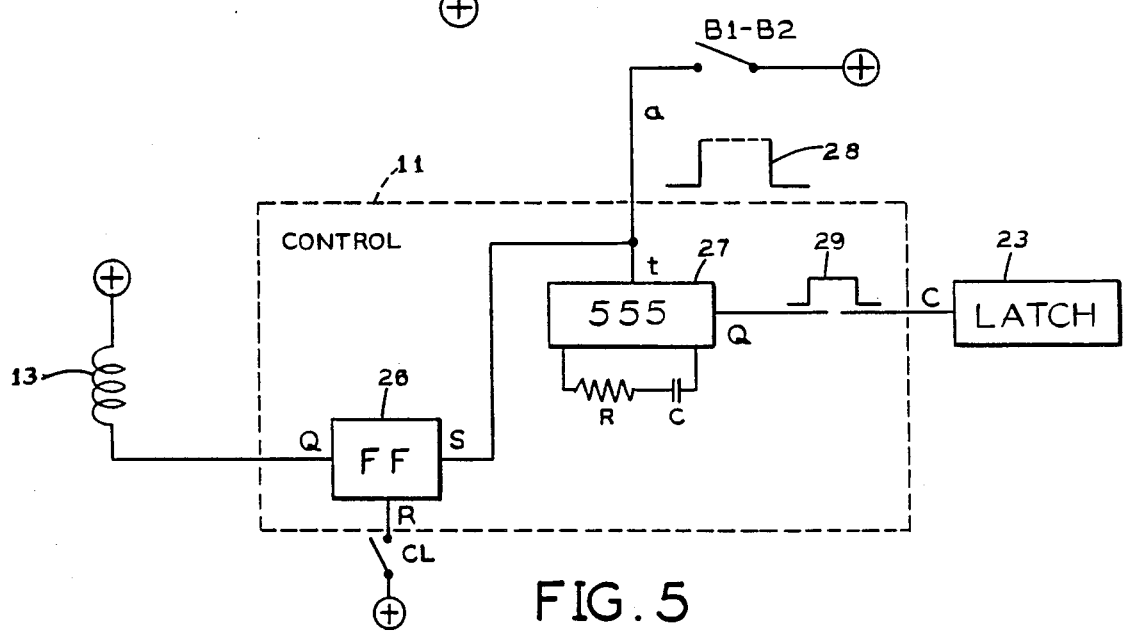
FIG. 5 is a circuit diagram showing the control circuit for the contact arm.

FIG. 5 shows details of the control circuit 11. The input a from switch contacts b1-b4 is connected to a timer circuit pin t, e.g. of the well known type 555 circuit. The trailing, negative going input pulse 28 causes the timer to generate an output pulse 29 which clears the latch 23, and the leading edge sets the flip-flop (R-S type) 26 at pin S which sets and operates the solenoid 15, as described above.

It follows that the contact arm 16 may alternatively swing in a plane other than a plane defined by the post 21, for example a horizontal plane, and that the linkage 19, spring 20, and the solenoid must be oriented accordingly.

It also follows that the test winding formed by elements 21, 17, 16, 18' and 18 may have more than a single turn if so desired for improved sensitivity. Each of the elements 21, 17, 16, 18" and 18 may have n conductors, forming a test winding with n turns.

The entire control circuit is powered by a power circuit 31, operated by an on-off switch 3, mounted on the working surface 2 of the device.

I claim:

1. A toroid turns counter for a toroid with at least one winding with turns to be counted by electric counting means connected to said winding, comprising a test winding with an opening for receiving said toroid, a movable contact arm for electrically closing said opening after the toroid has been received in said opening, activating means coupled to said contact arm, and automatic control means coupled to said activating means for controlling closure of said contact arm.

2. A toroid turns counter according to claim 1, including a servo mechanism in said activating means coupled to said contact arm.

3. A toroid turns counter according to claim 2 wherein said servo mechanism is an electric motor and linkage for coupling said motor with said contact arm.

4. A toroid turns counter according to claim 2 wherein said servo mechanism is an electric solenoid with an armature, and linkage for coupling said armature with said contact arm.

5. A toroid turns counter according to claim 1, wherein said activating means include switch means connected to said activating means, and a power source connected to said switch means for driving said activating means.

6. A toroid turns counter according to claim 5 including a start key with start contacts coupled to said switch means.

7. A toroid turns counter according to claim 1, wherein said test winding has a plurality of turns.

8. A toroid turns counter according to claim 1, wherein said movable contact arm is movable in a plane perpendicular to said toroid.

9. A toroid turns counter according to claim 1, wherein said toroid has a plurality of windings, and including selecting means for selectively measuring one winding at a time.

10. A toroid turns counter according to claim 9, including coupling means between said selecting means and said activating means for automatically activating said contact arm in response to operation of said selecting means.

* * * * *